United States Patent [19]
Aoki

[11] Patent Number: 6,136,708
[45] Date of Patent: Oct. 24, 2000

[54] METHOD FOR MANUFACTURING SEMICONDUCTOR DEVICE

[75] Inventor: Hidemitsu Aoki, Tokyo, Japan

[73] Assignee: NEC Corporation, Tokyo, Japan

[21] Appl. No.: 09/433,970

[22] Filed: Nov. 4, 1999

[30] Foreign Application Priority Data

Nov. 6, 1998 [JP] Japan .................................. 10-316324

[51] Int. Cl.[7] ................................................. H01L 21/44
[52] U.S. Cl. ........................ 438/687; 438/659; 438/584; 438/592; 438/605; 438/627; 438/643; 438/661
[58] Field of Search ..................................... 438/687, 659, 438/584, 592, 605, 627, 643, 661, 112, 124, 127, 598, 617

[56] References Cited

U.S. PATENT DOCUMENTS

| | | |
|---|---|---|
| 3,669,734 | 6/1972 | Jacob et al. ............................. 117/217 |
| 4,500,394 | 2/1985 | Rizzo . |
| 4,636,824 | 1/1987 | Ikoma et al. .......................... 357/23.14 |
| 4,866,505 | 9/1989 | Roberts et al. ............................. 357/71 |
| 5,121,183 | 6/1992 | Ogasawara et al. ....................... 357/30 |
| 5,574,741 | 11/1996 | Arimoto ..................................... 372/45 |
| 5,639,677 | 6/1997 | Lee et al. ............................. 437/40 LC |
| 5,654,245 | 8/1997 | Allen . |
| 5,821,168 | 10/1998 | Jain . |

FOREIGN PATENT DOCUMENTS 0 701 276   3/1996   European Pat. Off. .

*Primary Examiner*—Matthew Smith
*Assistant Examiner*—Victor Yevsikov

[57] ABSTRACT

A barrier film 5 such as silicon oxide film or the like is formed on the back surface of a semiconductor substrate. Then, a copper-based metal film is formed on the principal surface of the semiconductor substrate. (Selected Drawing: FIG. 2)

33 Claims, 9 Drawing Sheets

(a)

(b)

(c)

(a)

(b)

(a)

(b)

(a)

(b)

(a)

(b)

METHOD FOR MANUFACTURING SEMICONDUCTOR DEVICE

BACKGROUND OF THE INVENTION

1. Field of the Invention

The present invention relates to a method for manufacturing a semiconductor device comprising (a) a semiconductor substrate and (b) a wiring (made of a copper-based metal film) and a contact plug, both formed on the substrate (a).

2. Description of the Related Art

A conventional method for manufacturing a semiconductor device having a copper wiring is described below with reference to FIGS. 4 to 7.

First, a device-isolating region 21 is formed on the principal surface of a silicon substrate 1, after which a gate electrode 3 and an impurity-diffused layer 2 are formed and, as an inter-layer insulating film, a silicon oxide film 4 is formed by plasma CVD [FIG. 4(a)].

Next, a contact hole reaching the impurity-diffused layer 2 is formed in the silicon oxide film 4, by dry etching. Further, a Ti/TiN film 6 and a tungsten film 7 are formed in this order; the unnecessary portions of the Ti/TiN film 6 and the tungsten film 7, present outside the contact hole are removed by chemical mechanical polishing (CMP) to form a tungsten plug. Then, on the whole principal surface of the resulting substrate is formed a silicon nitride film 8 by plasma CVD [FIG. 4(b)].

Thereon is formed a silicon oxide film 9 as an inter-layer insulating film by plasma CVD. Then, dry etching is conducted in two stages in order to form a groove for wiring. In the first stage, etching of the silicon oxide film 9 is conducted using a mixed gas containing $C_4F_8$, Ar, $O_2$ and CO; in the second stage, etching of the silicon nitride film 8 is conducted using a $CHF_3$-based gas [FIG. 4(c)].

After the completion of the etching, a Ti/TiN film 11 is formed by sputtering. Thereon is formed, by sputtering, a seed metal (copper) film (not shown) in order to form thereon a copper plating. The resulting substrate is immersed in an aqueous copper sulfate solution of about 25° C., and electrolytic plating is conducted to form a copper plating film 12 selectively on the seed metal film. The thickness of the copper plating film 12 is controlled at about 1,000 nm at the flat portion. In the electrolytic plating, copper-based metal contaminants 30 (e.g. Cu and CuO) adhere to the back surface of the semiconductor substrate, in a large amount. This state is shown in FIG. 5(a).

The copper-based metal contaminants 30 are removed using a mixed solution consisting f dilute hydrofluoric acid and an aqueous hydrogen peroxide solution [FIG. 5(b)]. Then, annealing is conducted at 400° C. for about 30 minutes, whereby the grains constituting the copper plating film grow and there appear reduced resistance and stabilization.

Subsequently, the unnecessary portions of the Ti/TiN film 11 and the copper plating film 12, present outside the hole are removed by CMP to form a copper wiring. In the CMP, copper-based metal contaminants 30 (e.g. Cu and CuO) adhere to the back surface of the semiconductor substrate in a large amount. This state is shown in FIG. 6(a).

The copper-based metal contaminants 30 are removed using a mixed solution consisting of dilute hydrofluoric acid and an aqueous hydrogen peroxide solution [FIG. 6(b)]. Then, on the principal surface of the substrate is formed an inter-layer insulating film, after which an upper wiring is formed to complete a semiconductor device (FIG. 7).

In the above-mentioned conventional technique, metal contaminants (e.g. copper and copper compound) adhere to the back surface of a substrate during the formation of a copper-based metal film and the processing thereof (e.g. CMP and hole formation on copper wiring), as shown in FIG. 5(a) and FIG. 6(a). These copper-based metal contaminants adhere in a large amount particularly in the formation of a copper-based metal film and the CMP thereof. These metal contaminants diffuse into the substrate and reach the device region, in the subsequent heat treatment, deteriorating the properties of the device and causing current leakage. The diffusion of metal contaminants is striking when the heat treatment is conducted at high temperatures, for example, 300° C. or higher.

In order to avoid the above problem, it was necessary, in manufacturing a semiconductor device comprising a step of forming a copper-based metal film, to clean the back surface of a semiconductor substrate after the formation of a copper-based metal film and also after the processing of the copper-based metal. In forming a copper wiring of, for example, 8 layers, it was necessary to conduct the above cleaning about 50 to 80 times, which made the steps complicated.

Further, the copper-based metal contaminants, unlike tungsten, iron, nickel, aluminum, etc., are difficult to remove from the surface of silicon substrate and are impossible to completely remove by cleaning. The reason is as follows. The copper-based metal contaminants have a high redox potential; therefore, a redox reaction takes place between copper ion and silicon substrate; as a result, back adsorption of copper on silicon substrate takes place.

Therefore, there were cases that copper-based metal contaminants remained unremoved even after considerable times of cleaning. The remaining copper-based metal contaminants diffuse into the substrate, as shown in FIG. 7, and reach the impurity-diffused layer, the gate oxide film, the device-isolating oxide film, etc., deteriorating the properties of the device or causing current leakage.

The above-mentioned problem occurs because copper diffuses into the silicon substrate at a very high velocity. Therefore, the problem is peculiar to when a copper-based metal film is formed.

The above-mentioned conventional technique includes a step of polishing tungsten by CMP. In this step as well, metal contaminants adhere to the back surface of substrate. With respect to these metal contaminants which are tungsten particles or iron particles (the latter particles are derived from the abrasive used in CMP), however, there hardly occur the above-mentioned problem of diffusion into silicon substrate and adverse effect on device region. The tungsten particles and the iron particles diffuse into the silicon substrate at a very low velocity; their arrival at device region in heat treatment after CMP is rare; the tungsten particles, in particular, peel easily from the silicon substrate. Further, these particles can be removed by polishing the back surface of substrate in the final step.

SUMMARY OF THE INVENTION

In view of the above-mentioned situation, the present invention aims at preventing, in the method for manufacturing a semiconductor device, comprising a step of forming a copper-based metal film, the property deterioration of device or current leakage caused by the metal contaminants (e.g. copper and copper compound) adhering to the back surface of semiconductor substrate.

According to the present invention, there is provided A method for manufacturing a semiconductor device, which comprises forming a barrier film on the back surface of a semiconductor substrate and then forming a copper-based metal film on the principal surface of the semiconductor substrate.

In the above method for manufacturing a semiconductor device, a copper-based metal film is formed after the formation of a barrier metal. Therefore, the copper-based contaminants arising from the formation of the copper-based metal film adhere to the surface of the barrier film formed on the back surface of semiconductor substrate. Since the diffusion velocity of the copper-based contaminants in the barrier film is very low, the barrier acts as a diffusion-preventing film and can prevent the diffusion of the copper-based contaminants into the semiconductor substrate. Therefore, it is not necessary to clean the back surface of substrate each time when a copper-based film or a groove on copper wiring has been formed; cleaning may be conducted only to prevent the cross-contamination in film-forming apparatus, etc.; as a result, significant reduction in production steps is made possible. Further, since the copper-based metal contaminants adhering to the surface of barrier film can be removed far more easily than those adhering to the surface of silicon substrate, the problem associated with the diffusion of such contaminants can be eliminated effectively.

Incidentally, in the present invention, the "copper-based metal film" refers to a metal film made of copper or a copper alloy. The copper alloy refers to, for example, a copper/aluminum alloy. The content of copper in the copper/aluminum alloy can be 90 to 100%.

According to the present invention, there is further provided a method for manufacturing a semiconductor device comprising the steps of:

forming a gate electrode and a diffused layer on the principal surface of a semiconductor substrate and then applying a heat treatment, forming a barrier film on the back surface of the semiconductor substrate, and forming a copper-based metal film on the principal surface of the semiconductor substrate.

In the above method for manufacturing a semiconductor device, a gate electrode and a diffused layer are formed on the principal surface of a semiconductor substrate; a heat treatment is applied; then, a barrier film is formed. Since no barrier film is not yet formed on the back surface of the substrate at the time of the heat treatment, the temperature control of the heat treatment can be conducted at a high precision.

The above heat treatment is conducted in order to activate the impurities contained in the gate electrode and the diffused layer. As the method for the heat treatment, there is preferably used RTA (rapid thermal annealing) such as lamp annealing or the like, which can conduct the activation efficiently in a short time. Ordinarily in the heat treatment by RTA, the temperature of substrate surface is kept at 900 to 1,100° C. and the annealing time is about 10 to 60 seconds; thus, very precise temperature control is necessary. If a barrier film is present on the back surface of substrate at the time of RTA, the very precise temperature control is difficult to make owing to the difference in thermal conductivity or specific heat between substrate material and barrier film material. In the present method for manufacturing a semiconductor device, however, the above problem is avoided by conducting the barrier film formation after the heat treatment.

According to the present invention, there is furthermore provided a method for manufacturing a semiconductor device comprising the steps of:

forming a gate electrode and a diffused layer on the principal surface of a semiconductor substrate and then applying a heat treatment, forming an insulating film on the gate electrode and the diffused layer and then forming, in the insulating film, a contact plug reaching the gate electrode and/or the diffused layer, forming a barrier film on the back surface of the semiconductor substrate, and forming a copper-based metal film on the principal surface of the semiconductor substrate.

In manufacturing a semiconductor device, it is necessary to hold a semiconductor substrate in a holder when the substrate is transferred or subjected to film formation. The holding of the substrate may not be done satisfactorily when the substrate is statically charged at the back surface. Further, it may be difficult to take out the substrate from the holder; hence, a special operation for taking out the holder may become necessary, or, the substrate may be damaged at the time of taking it out. Therefore, it is desirable to minimize the charging of the back surface of semiconductor substrate with static electricity.

The barrier film such as a silicon oxide film formed at the back surface of semiconductor substrate (silicon substrate) is charged with static electricity more easily than the silicon substrate does. Therefore, the timing at which the barrier film is formed, is preferably right before the step of formation of copper-based metal film (this step is necessarily conducted in the presence of the barrier film).

The present method for manufacturing a semiconductor device comprises a step of forming a contact plug. Since the contact plug is formed in the vicinity of a device region, the metal filled in the plug is not a copper-based metal but tungsten or the like ordinarily. Therefore, no barrier film is required at the back surface of semiconductor substrate, in the step of contact plug formation and it is preferred to form a barrier film after the step. From such a standpoint, in the present method, a barrier film is formed at the back surface of substrate, after the formation of a contact plug. Thereby, the holding of substrate in holder or the taking-out of substrate from holder, necessary when the substrate is transferred or subjected to film (e.g. tungsten film) formation and subsequent CMP, can be conducted smoothly.

In the present method, the formation of contact plug is conducted, for example, as follows. First, a contact hole reaching a gate electrode and/or a diffused layer is formed in an insulating film by dry etching. Next, a barrier metal film made of Ti, TiN or the like and a conductive film made of tungsten or the like are formed in this order. Then, CMP is conducted to remove the unnecessary portions of the barrier metal film and the conductive film to form a contact plug.

As described above, according to the present invention, a barrier film is formed at the back surface of wafer prior to the formation of a copper-based metal film and, thereby, the diffusion of copper-based contaminants into substrate can be prevented. As a result, it is not necessary to clean the back surface of substrate each time when a copper-based metal film or a groove on copper wiring is formed; the cleaning may be conducted only to prevent the cross-contamination in exposure apparatus or film-forming apparatus; and the production steps can be reduced significantly. Further, the copper-based metal contaminants adhering to the barrier film can be removed far more easily than those adhering to the silicon substrate, and the problem associated with the diffusion of remaining contaminants can be eliminated effectively.

DETAILED DESCRIPTION OF THE PREFERRED EMBODIMENTS

Figure 1:
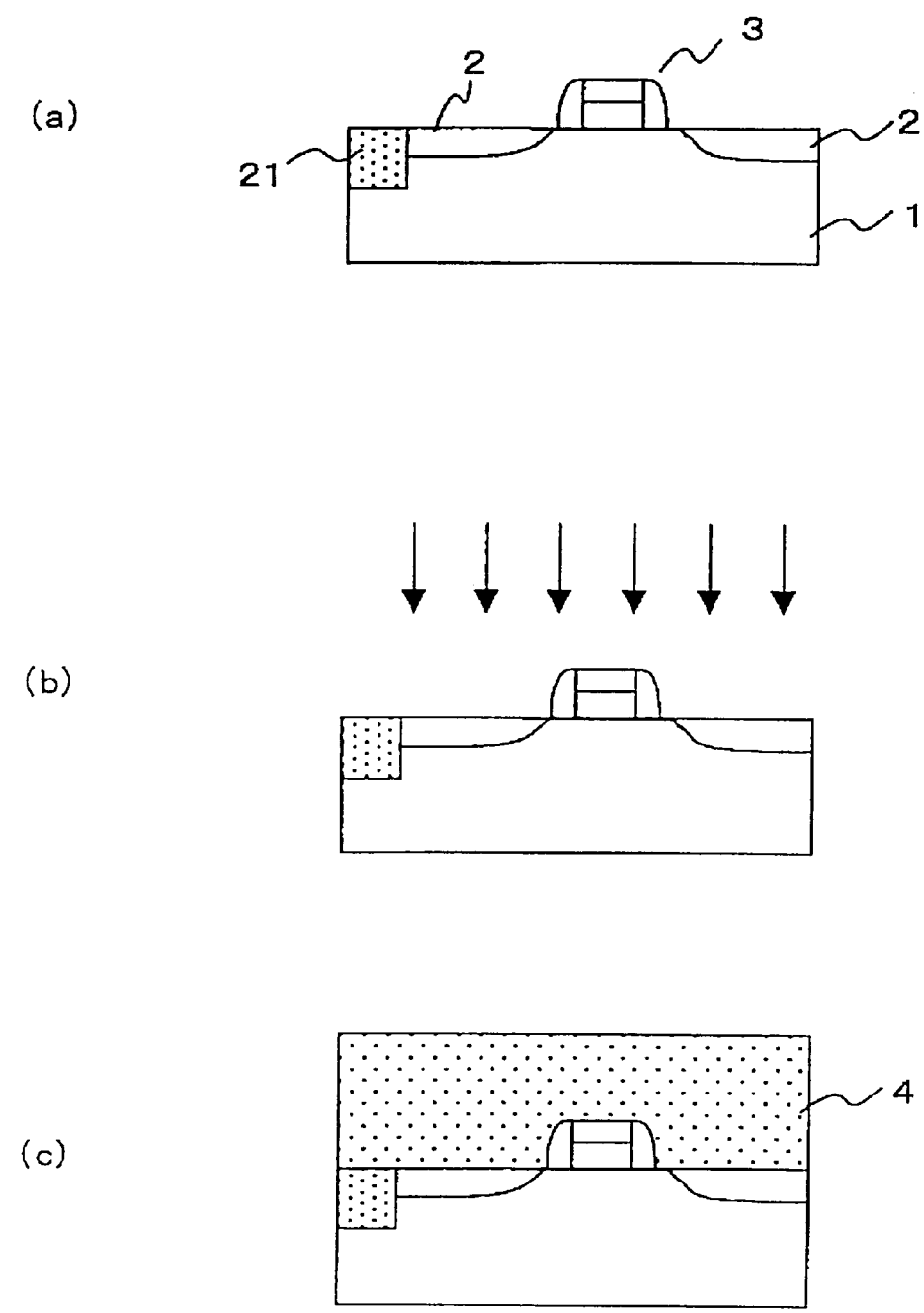
FIGS. 1a–1c are sectional views showing steps of the method for manufacturing a semiconductor device of the present invention.

In the present method for manufacturing a semiconductor device, the formation of copper-based metal film can be conducted by forming a copper-based metal film on the principal surface of a semiconductor substrate and then removing the unnecessary portion of the film. In both of the step of film formation and the step of unnecessary portion removal, copper-based metal contaminants adhere to the back surface of the substrate. The adhesion is striking in the step of unnecessary portion removal. According to the present method, since a barrier film is formed on the back surface of the substrate, the copper-based metal contaminants adhering to the barrier film do not diffuse into the substrate, whereby the property deterioration of device and current leakage can be prevented.

The removal of the unnecessary portion of copper-based metal film is conducted preferably by chemical mechanical polishing (CMP). The CMP employed as part of damascene process allows easy formation of, for example, a wiring made of a copper-based metal film (the film is difficult to etch), but incurs striking adhesion of copper-based metal contaminants to substrate back surface and causes high contamination. Hence, when CMP was used in the conventional technique, very elaborate cleaning was necessary. Further, the copper-based metal contaminants caused by CMP could not be removed sufficiently by the cleaning and part of them often diffused into the substrate. In contrast, in the present production method, since a barrier film is formed on the back surface of substrate, the copper-based metal contaminants adhering to the barrier film do not diffuse into the substrate and the above-mentioned problem can be eliminated.

The step of formation of a copper-based metal film in the present invention can be a step of applying a plating treatment using a copper-based metal material and then applying an annealing treatment at a substrate temperature of 300° C. or higher to form a copper-based metal film. In formation of a copper-based metal film, there is mainly used sputtering, CVD or plating. Of these, plating, particularly electrolytic plating is advantageous in that a good coverage is obtained and the process is relatively simple. When plating is used, the subsequent annealing must be conducted at a high temperature (300° C. or higher but ordinarily not higher than 400° C.) for about 30 to 90 minutes in order to grow the grains constituting the copper plating film formed, reduce the resistance of the film and stabilize the film. Annealing at such a high temperature gives rise to the diffusion of the copper-based metal contaminants adhering to the back surface of substrate, into the substrate. In the present production method, however, since a barrier film is formed on the back surface of substrate, the copper-based metal contaminants adhering to the barrier film do not diffuse into the substrate and the above problem is eliminated.

In the present invention, the barrier film is made of such a material that the diffusion of copper-based metal contaminants therethrough is more difficult than at least the diffusion through silicon substrate. The material is, for example, one for which copper has a diffusion coefficient at 300 to 600° C., of ⅓ or less of the copper diffusion coefficient for single crystal silicon. Specifically, the barrier film is preferred to be a silicon oxide film or a silicon nitride film. Such a film can prevent the diffusion of copper-based metal contaminants into semiconductor substrate and moreover allows easy removal of the copper-based metal contaminants by cleaning. The barrier film may be a composite film consisting of a first film made of Ta, TaN, TiN, SiN or SiON and a second film which is a silicon oxide film, wherein the second film is provided at the outer side. The first film has a higher barrier property to copper-based metal contaminants than the second film (silicon oxide film) does and, therefore, can effectively prevent the diffusion of contaminants into substrate. It is necessary that the second film is provided at the outer side of the composite film. The reason is that if the first film is provided at the outer side, a metal such as Ta, Ti or the like is exposed, adheres to the apparatus for semiconductor device production and causes cross-contamination; or, a SiN film or the like is peeled, causing dust contamination.

When the barrier film is made of a silicon oxide film, the film is preferably formed by CVD. It is because CVD, as compared with thermal oxidation, has a higher degree of step freedom. When, for example, thermal oxidation [which is a high-temperature (800° C. or higher) process] is employed for formation of a barrier film, the barrier film must be formed before the formation of a gate electrode and a diffused layer. In such an operation sequence, however, there may be cases that in the heat treatment conducted after the formation of the gate electrode and the diffused layer, the temperature control is difficult as mentioned previously. This problem is striking particularly when the heat treatment is conducted by RTA (e.g. lamp annealing). This problem can be eliminated when the barrier film made of a silicon oxide film is formed by CVD, after the heat treatment.

The thickness of the barrier film is set preferably at 30 to 500 nm, more preferably at 80 to 200 nm. A thickness of 30 nm or larger can satisfactorily prevent the diffusion of copper-based metal contaminants into semiconductor substrate. A thickness of 500 nm or smaller can minimize the charging of barrier film with static electricity and can make smooth, in substrate transfer or film formation, the holding of substrate in holder and taking-out of substrate from holder. When the barrier film is a composite film consisting of a first film made of Ta, TaN, TiN, SiN or SiON and a second film which is a silicon oxide film, the total thickness is preferably in the above range and the thickness of the first film is preferably 10 to 200 nm, more preferably 20 to 100 nm.

In the present method, when a copper-based metal film is formed on the principal surface of a semiconductor substrate in an apparatus for formation of the film and then the resulting substrate is transferred into other apparatus for treatment of copper-based metal or other metals, the surface of the barrier film formed on the substrate can be cleaned prior to the above transfer. This cleaning is necessary to prevent the cross-contamination which occurs by adhesion of copper-based metal contaminants present on the barrier film, to the back surfaces of other wafers having no barrier film formed thereon. The cleaning of the barrier film surface is conducted preferably by using a cleaning solution. The cleaning may be dry cleaning, but wet cleaning using a cleaning solution can achieve effective removal of copper-based metal contaminants. When the formation of a copper-based metal film is conducted by formation of a copper-based metal film and subsequent removal of the unnecessary portion of the film, the cleaning of the barrier film is conducted after the removal of the unnecessary portion of copper-based metal film.

The cleaning solution used may be, for example, dilute hydrofluoric acid or a mixed solution of dilute hydrofluoric acid and an aqueous hydrogen peroxide solution, but is preferably a cleaning solution containing a complexing agent capable of forming a complex with copper-based metal contaminants but containing no hydrofluoric acid. When dilute hydrofluoric acid or the like is used, thinning of barrier film takes place and, when a multi-layered wiring is formed, reformation of barrier film may be necessary. This easily takes place particularly when the barrier film is a silicon oxide film. In contrast, when there is used, as the cleaning solution, a cleaning solution containing a complexing agent capable of forming a complex with copper-based metal contaminants, there is no thinning of barrier film and, moreover, the amount of copper-based metal contaminants remaining on barrier film can be made significantly small. Preferable examples of such a complexing agent are those containing at least one kind of compound selected from the group of three kinds of compounds consisting of (a) a polyaminocarboxylic acid, (b) a carboxylic acid excluding polyaminocarboxylic acids and (c) ammonium fluoride. By using such a complexing agent, the metal contaminants which have adhered to the barrier film formed on the back surface of substrate, can be removed effectively without etching the barrier film, and readhesion of metal contaminants can be prevented.

The polyaminocarboxylic acid (a) refers to a carboxylic acid having a plurality of amino groups and a plurality of carboxyl groups in the molecule, or a salt thereof. There can be mentioned, for example, compounds such as ethylenediaminetetraacetic acid (EDTA), trans-1,2-cyclohexanediaminetetraacetic acid (CyDTA), nitrilotriacetic acid (NTA), diethylenetriaminepentaacetic acid (DTPA), N-(2-hydroxyethyl)ethylenediamine-N,N',N'-triacetic acid (EDTA-OH) and the like; and salts thereof. When a salt is used, the salt is preferably one which does not adversely affect the properties of semiconductor device, particularly a metal-free salt such as ammonium salt. The amount of the polyaminocarboxylic acid used is preferably 1 to 1,000 ppm. When the amount is too small, no sufficient chelating effect is obtained. When the amount is too large, the compound remains on the surface of substrate and deteriorates the properties of semiconductor device, or a large cost is required for disposal of the used complexing agent.

As the carboxylic acid (b) excluding polyaminocarboxylic acids, there can be mentioned, for example, oxalic acid, citric acid, malic acid, maleic acid, succinic acid, tartaric acid, malonic acid, and salts thereof. When a salt is used, the salt is preferably one which does not adversely affect the properties of semiconductor device, particularly a metal-free salt such as ammonium salt. The amount of the carboxylic acid used is preferably 0.05 to 5% of the cleaning solution. When the amount is too small, no sufficient chelating effect is obtained. When the amount is too large, the compound remains on the surface of substrate and deteriorates the properties of semiconductor device, or a large cost is required for disposal of the used complexing agent.

The ammonium fluoride (c) may be used. The amount of the component (c) used is preferably 1 to 1,000 ppm of the cleaning solution.

In the present invention, when there is used a complexing agent containing both of the polyaminocarboxylic acid (a) and the carboxylic acid (b) excluding polyaminocarboxylic acids, a higher effect for removal of metal contaminants can be obtained. The reason is not clear but is presumed to be that the polyaminocarboxylic acid and the carboxylic acid excluding polyaminocarboxylic acids are slightly different in the kinds of metal contaminants to which they are effective. The copper-based metal contaminants generated as a result of formation or CMP of copper-based metal film or dry etching of insulating film on copper-based metal film are thought to be a mixture of a plurality of compounds. Therefore, when there is used a cleaning solution containing both of the polyaminocarboxylic acid and the carboxylic acid excluding polyaminocarboxylic acids, the two components act complementarily because they are effective to different contaminants, and contaminants consisting of a variety of metal compounds can be removed. When the two components (a) and (b) are used, each component is used in the same amount as mentioned above.

In the present method for manufacturing a semiconductor device, particularly, the method comprising a step of forming a contact plug, it is possible to form an etching stopper film (e.g. a silicon nitride film) or an inter-layer insulating film between the step of contact plug formation and the step of barrier film formation. For example, it is possible that an inter-layer insulating film is formed after contact plug formation and then a copper-based metal film is formed.

The copper-based metal film can be formed by a damascene process or the like. For example, a dent is formed at a predetermined position of the inter-layer insulating film; then, a copper-based metal film is formed so as to fill the dent; thereafter, the unnecessary portion of the copper-based metal film is removed to complete a final copper-based metal film. The removal of the unnecessary portion of copper-based metal film is conducted by CMP or the like.

EXAMPLE 1

Figure 2:
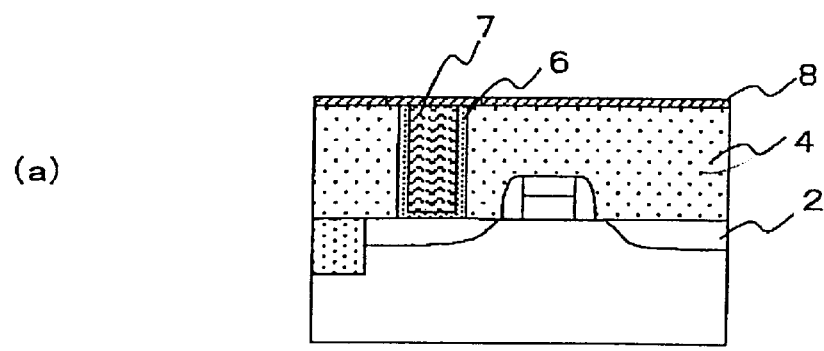
FIGS. 2a–2c are sectional views showing steps of the method for manufacturing a semiconductor device of the present invention.
Figure 2:
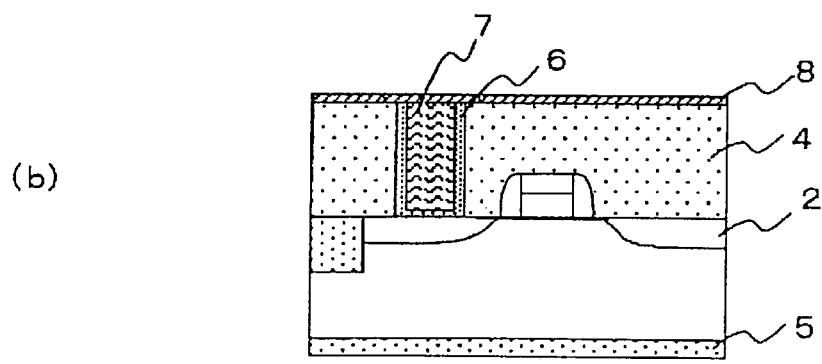
Figure 2:
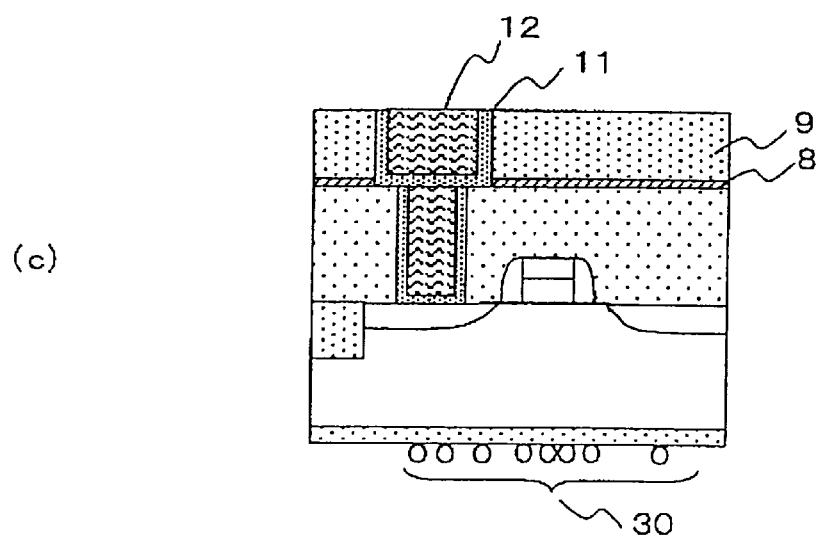
Figure 3:
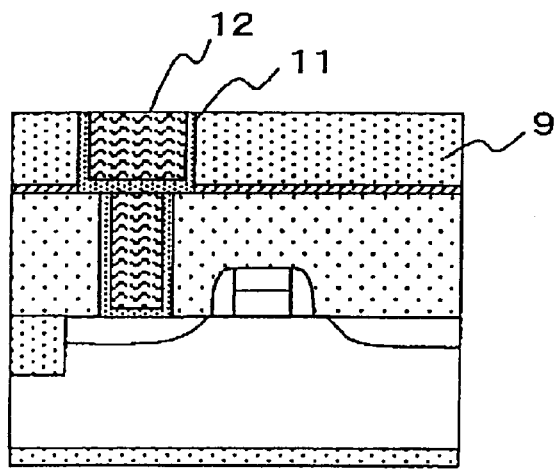
FIGS. 3a–3b are sectional views showing steps of the method for manufacturing a semiconductor device of the present invention.
Figure 3:
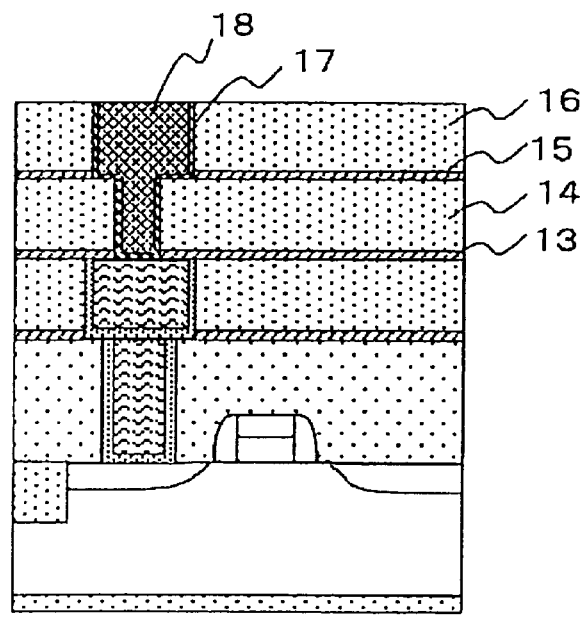
Figure 4:
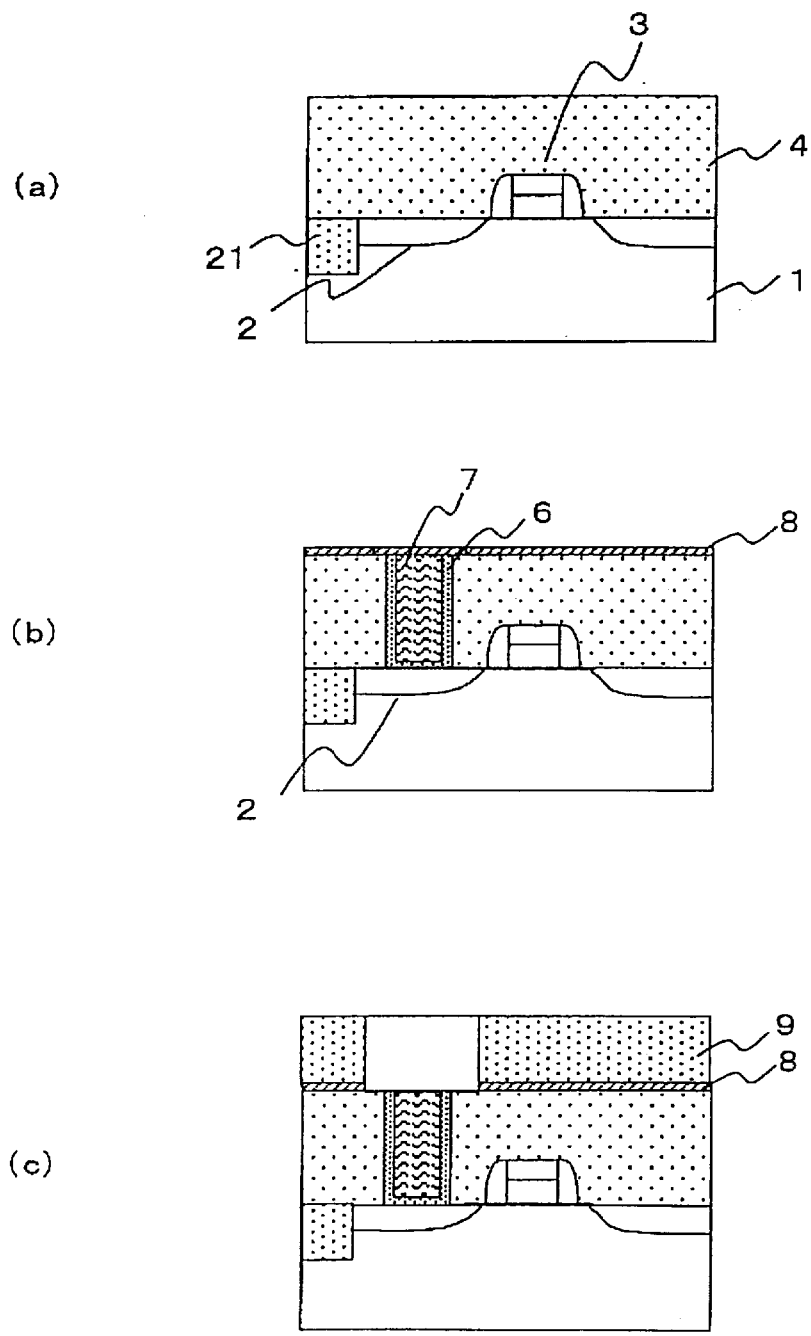
FIGS. 4a–4b are sectional views showing steps of a conventional method for manufacturing a semiconductor device.
Figure 5:
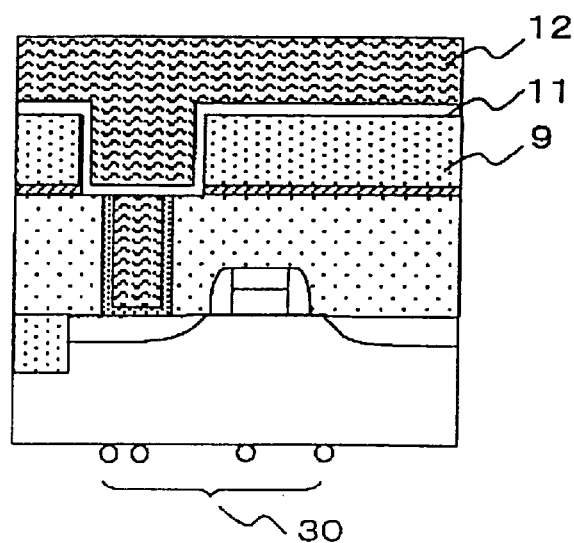
FIGS. 5a–5b are sectional views showing steps of a conventional method for manufacturing a semiconductor device.
Figure 5:
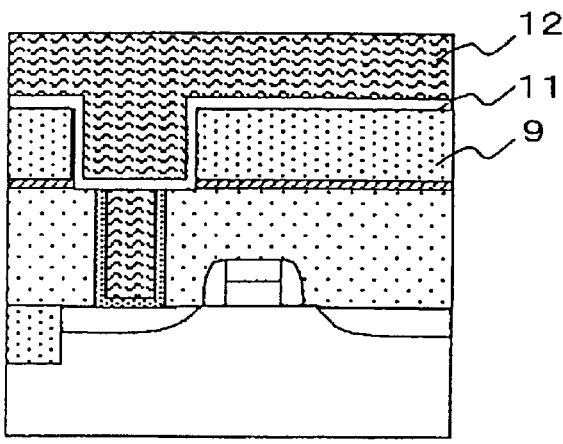
Figure 6:
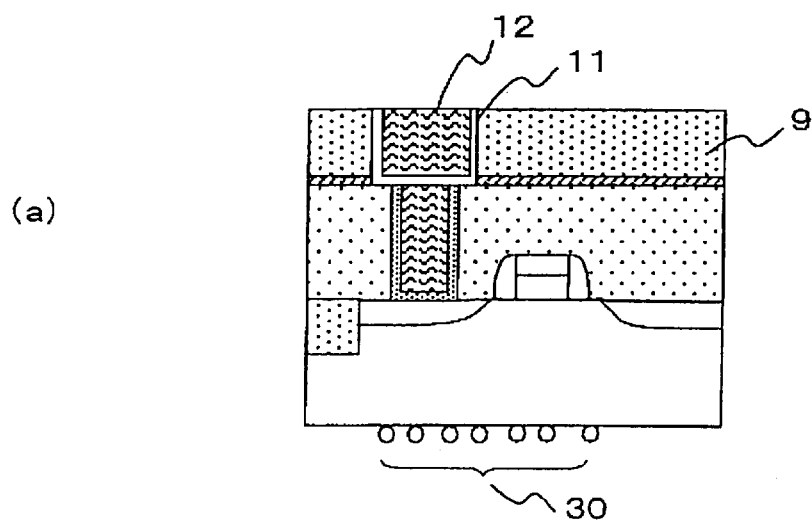
FIGS. 6a–6b are sectional views showing steps of a conventional method for manufacturing a semiconductor device.
Figure 6:
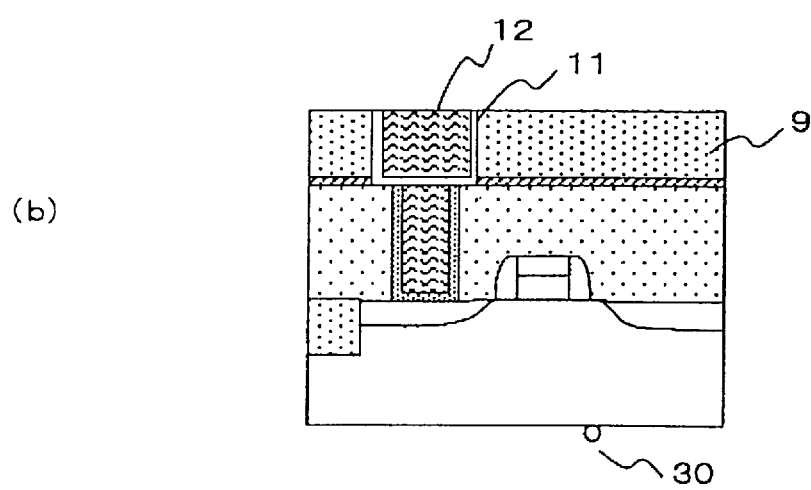
Figure 7:
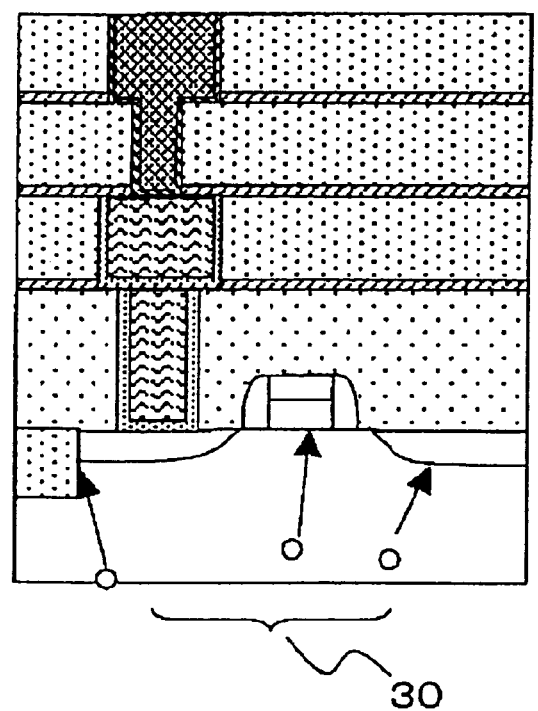
FIG. 7 is a sectional view showing steps of a conventional method for manufacturing a semiconductor device.

The present invention is described with reference to FIGS. 1 to 3.

First, a device-isolating region 21 was formed on the principal surface of a silicon substrate 1; then, a gate electrode 3 made of a polycrystalline silicon was formed on the same principal surface; thereafter, $BF_3$ was ion-implanted at the whole principal surface [FIG. 1(a)]. Incidentally, the material for gate electrode may be, besides the polycrystalline silicon, a silicide, a polysilicide or the like. Thereby, an impurity-diffused is layer 2 was formed. Successively, a lamp annealing treatment was applied at 1,000° C. for 30 seconds to activate the impurity contained in the gate electrode and the diffused layer 2 [FIG. 1(b)]. Then, on the whole principal surface of the resulting substrate was formed, by plasma CVD, a silicon oxide film 4 as an inter-layer insulating film [FIG. 1(c)].

Next, a contact hole reaching the impurity-diffused layer 2 was formed in the silicon oxide film 4 by dry etching. Further, a Ti/TiN film 6 and a tungsten film 7 were formed in this order. The unnecessary portions of the Ti/TiN film 6 and the tungsten film 7, present outside the contact hole were removed by CMP to form a tungsten plug. On the whole principal surface of the resulting substrate was formed a silicon nitride film 8 by plasma CVD [FIG. 2(a)].

Next, on the back surface of the substrate was formed a barrier film 5 (thickness: 50 nm) made of $SiO_2$, by plasma CVD [FIG. 2(b)].

Successively, on the principal surface of the substrate was formed a silicon oxide film 9 as an inter-layer insulating film by plasma CVD. Then, two-stage dry etching was conducted in order to form a groove for wiring. In the first stage, the silicon oxide film 9 was etched using a mixed gas containing $C_4F_8$, Ar, $O_2$ and CO; in the second stage, the silicon nitride film 8 was etched using a $CHF_3$-based gas. After the completion of the etching, on the whole principal surface of the resulting substrate was formed, by sputtering, a barrier metal film 11 (thickness: 20 nm) made of Ti and TiN. Thereon was formed, by sputtering, a seed metal film (a copper film) (not shown) necessary for formation of copper plating film thereon. The resulting substrate was immersed in an aqueous copper sulfate solution of about 25° C., and electrolytic plating was conducted to form a copper plating film 12. The copper plating film 12 had a thickness of about 900 nm at the flat portion. Then, the unnecessary portions of the Ti/TiN film 11 and the copper plating film 12, present outside the groove were removed by CMP to form a copper wiring. In this CMP, a large amount of copper-based metal contaminants 30 (e.g. copper and copper compound) adhere to the back surface of the semiconductor substrate. This state is shown in FIG. 2(c).

Successively, the oxide film 5 at the back surface of the semiconductor substrate was cleaned. The cleaning at this stage is necessary in order to prevent the cross-contamination in film-forming apparatus which may occur in the next step of silicon oxide film formation or silicon nitride film formation. Here, the "cross-contamination" refers to contamination between wafers which occurs, for example, when part of the metal contaminants adhering to a wafer leave the wafer and adhere to other wafers in other wafer-treating apparatus or when part of the metal contaminants adhering to the back surface of wafer adhere to other wafers via the handler of the wafer. In the cleaning, there was used, as the cleaning solution, a mixture of a 0.3% (by weight) aqueous oxalic acid solution and 10 ppm of ethylenediaminetetraacetic acid (EDTA). The cleaning was conducted by immersing the substrate in the cleaning solution for 5 minutes. Then, the substrate was immersed in pure water for 5 minutes for rinsing. Thereby, the copper-based metal contaminants 30 are removed substantially completely [FIG. 3(a)].

Next, there were formed a silicon nitride film 13, a silicon oxide film 14, a silicon nitride film 15 and a silicon oxide film 16. Then, a via hole and an upper wiring were formed by a so-called dual damascene process. That is, multi-stage etching was conducted with the aperture of mask and the etching gas varied, to form a groove having a T-shaped section; in this groove were formed a Ti/TiN film 17 and a copper plating film 18. Then, the unnecessary portions of the Ti/TiN film 17 and the copper plating film 18, present outside the groove were removed by CMP to form an upper wiring. In this CMP, a large amount of metal contaminants (e.g. copper and copper compound) (not shown) adhere to the back surface of semiconductor substrate. Therefore, in the same manner as in the step of FIG. 3(a), the oxide film 5 on the back surface of semiconductor substrate was cleaned. That is, there was used, as the cleaning solution, a mixture of a 0.3% (by weight) aqueous oxalic acid solution and 10 ppm of ethylenediaminetetraacetic acid (EDTA); the substrate was immersed in the cleaning solution for 5 minutes; then, the substrate was immersed in pure water for 5 minutes for rinsing. Thereby, the metal contaminants are removed substantially completely. This state is shown in FIG. 3(b).

Then, the barrier film 5 at the back surface of semiconductor substrate was removed by CMP or the like, to complete a semiconductor device. In the present Example, the barrier film 5 was removed; however, it is possible to incorporate a device having the barrier film, into a package.

In the present Example, the cleaning of the substrate back surface is conducted only after the CMP conducted in copper wiring formation. In the conventional method, cleaning was necessary also after the etching step for groove formation on copper wiring, the subsequent ashing step (not shown), the copper plating step, etc., making the total steps complicated. Further, part of the copper-based metal contaminants remained even after cleaning, causing various problems. According to the method of the present Example, reduction in production steps is possible and the problem of diffusion of copper-based metal contaminants into substrate can be eliminated.

EXAMPLE 2

Figure 8:
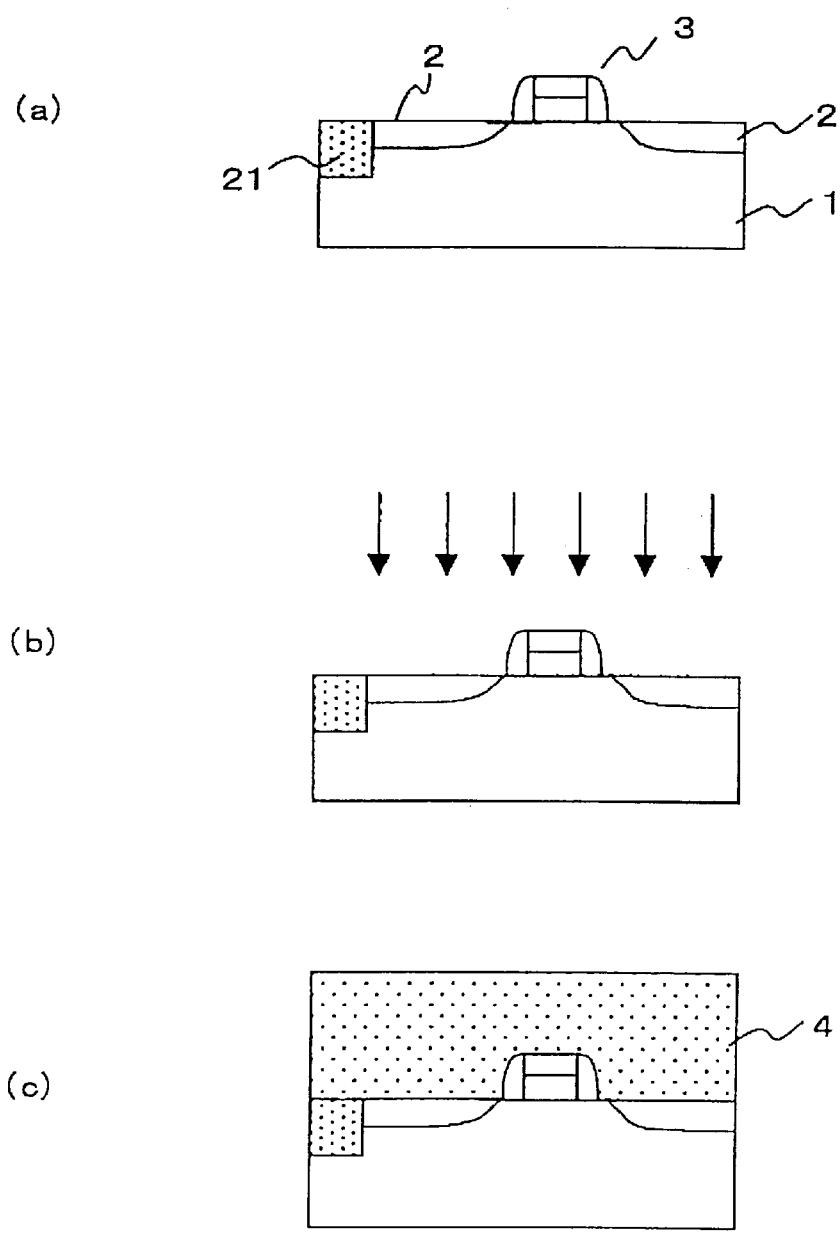
FIGS. 8a–8c are sectional views showing steps of the method for manufacturing a semiconductor device of the present invention.
Figure 9:
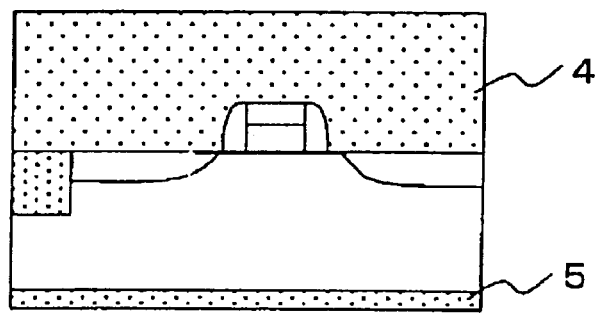
FIGS. 9a–9b are sectional views showing steps of the method for manufacturing a semiconductor device of the present invention.
Figure 9:
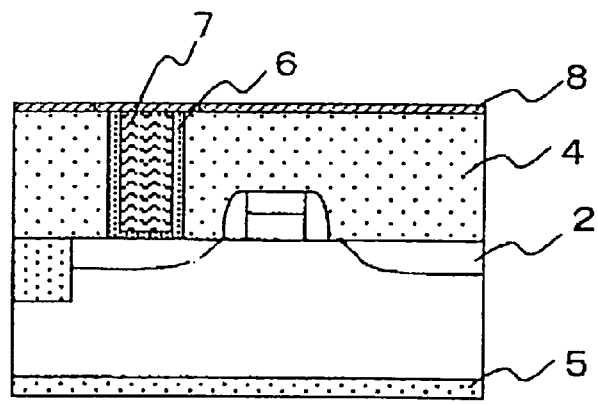

The present Example is a case in which the formation of a barrier film made of $SiO_2$ was conducted before the formation of a contact hole. The present Example is described below with reference to FIGS. 8 and 9.

First, a device-isolating region 21 was formed on the principal surface of a silicon substrate 1; then, a gate electrode 3 made of a polycrystalline silicon was formed on the same principal surface; thereafter, $BF_3$ was ion-implanted at the whole principal surface [FIG. 8(a)]. Thereby, an impurity-diffused layer 2 was formed. Successively, a lamp annealing treatment was applied at 1,000° C. for 30 seconds to activate the impurity contained in the gate electrode and the diffused layer 2 [FIG. 8(b)]. Then, on the whole principal surface of the resulting substrate was formed, by plasma CVD, a silicon oxide film 4 as an inter-layer insulating film [FIG. 8(c)].

Next, on the back surface of the substrate was formed a barrier film 5 (thickness: 50 nm) made of $SiO_2$, by plasma CVD [FIG. 9(a)].

Successively, a contact hole reaching the impurity-diffused layer 2 was formed in the silicon oxide film 4 by dry etching. Further, a Ti/TiN film 6 and a tungsten film 7 were formed in this order. The unnecessary portions of the Ti/TiN film 6 and the tungsten film 7, present outside the contact hole were removed by CMP to form a tungsten plug. On the whole principal surface of the resulting substrate was formed a silicon nitride film 8 by plasma CVD [FIG. 9(b)].

The later steps were conducted in the same manner as in the steps of FIG. 3(b) and later of Example 1, to complete a semiconductor device.

In the present Example as well, reduction in production steps is possible and the problem of diffusion of copper-based metal contaminants into substrate can be eliminated.

EXAMPLE 3

A semiconductor device was produced in the same manner as in Example 1 except that the constitution of the barrier film 5 was changed. In the present Example, a barrier film 5 was formed as follows in the step of FIG. 2(b). First, on the back surface of substrate was formed a Ta film (thickness: 50 nm) by sputtering. Then, a $SiO_2$ film (thickness: 50 nm) was formed by plasma CVD. Thereby, a barrier film 5 (thickness: 100 nm) made of $TaN/SiO_2$ was formed.

In the present invention, the barrier film 5 was formed in the form of a composite film having a higher barrier property to copper-based metal contaminants than a $SiO_2$ film does; therefore, the diffusion of copper-based metal contaminants into substrate can be prevented more effectively.

This application is based on Japanese patent application NO.HEI10-316324, the content of which is incorporated hereinto by reference.

What is claimed is:

1. A method for manufacturing a semiconductor device, which comprises forming a barrier film on a back surface of a semiconductor substrate and then forming a copper-based metal film on a principal surface of the semiconductor substrate.

2. A method for manufacturing a semiconductor device according to claim 1, wherein the formation of the copper-based metal film is conducted by forming a copper-based metal film and then removing the unnecessary portion of the copper-based metal film.

3. A method for manufacturing a semiconductor device according to claim 2, wherein the removal of the unnecessary portion of the copper-based metal film is conducted by chemical mechanical polishing.

4. A method for manufacturing a semiconductor device according to claim 2, wherein the formation of the copper-based metal film is conducted by applying a plating treatment with a copper-based metal material arid then applying an annealing treatment with the substrate temperature kept at 300° C. or higher.

5. A method for manufacturing a semiconductor device according to claim 1, wherein the barrier film is a silicon oxide film.

6. A method for manufacturing a semiconductor device according to claim 5, wherein the silicon oxide film is formed by CVD.

7. A method for manufacturing a semiconductor device according to claim 1, wherein the barrier film is a composite film consisting of a first film made of Ta, TaN, TiN, SiN or SiON and a second film which is a silicon oxide film, with the second film provided at the outer side of the composite film.

8. A method for manufacturing a semiconductor device according to claim 7, wherein the silicon oxide film is formed by CVD.

9. A method for manufacturing a semiconductor device according to claim 1, wherein, after the copper-based metal film has been formed, the surface of the barrier film is cleaned with a cleaning solution.

10. A method for manufacturing a semiconductor device according to claim 9, wherein the cleaning solution contains a complexing agent capable of forming a complex with copper-based contaminants.

11. A method for manufacturing a semiconductor device according to claim 10, wherein the complexing agent contains at least one kind of compound selected from the group of three kinds of compounds consisting of (a) a polyaminocarboxylic acid, (b) a carboxylic acid excluding polyaminocarboxylic acids and (c) ammonium fluoride.

12. A method for manufacturing a semiconductor device comprising the steps of:

forming a gate electrode and a diffused layer on a principal surface of a semiconductor substrate and then applying a heat treatment, forming a barrier film on a back surface of the semiconductor substrate, and forming a copper-based metal film on the principal surface of the semiconductor substrate.

13. A method for manufacturing a semiconductor device according to claim 12, wherein the formation of the copper-based metal film is conducted by forming a copper-based metal film and then removing the unnecessary portion of the copper-based metal film.

14. A method for manufacturing a semiconductor device according to claim 13, wherein the removal of the unnecessary portion of the copper-based metal film is conducted by chemical mechanical polishing.

15. A method for manufacturing a semiconductor device according to claim 13, wherein the formation of the copper-based metal film is conducted by applying a plating treatment with a copper-based metal material and then applying an annealing treatment with the substrate temperature kept at 300° C. or higher.

16. A method for manufacturing a semiconductor device according to claim 12, wherein the barrier film is a silicon oxide film.

17. A method for manufacturing a semiconductor device according to claim 16, wherein the silicon oxide film is formed by CVD.

18. A method for manufacturing a semiconductor device according to claim 12, wherein the barrier film is a composite film consisting of a first film made of Ta, TaN, TiN, SiN or SiON and a second film which is a silicon oxide film, with the second film provided at the outer side of the composite film.

19. A method for manufacturing a semiconductor device according to claim 18, wherein the silicon oxide film is formed by CVD.

20. A method for manufacturing a semiconductor device according to claim 12, wherein, after the copper-based metal film has been formed, the surface of the barrier film is cleaned with a cleaning solution.

21. A method for manufacturing a semiconductor device according to claim 20, wherein the cleaning solution contains a complexing agent capable of forming a complex with copper-based contaminants.

22. A method for manufacturing a semiconductor device according to claim 21, wherein the complexing agent contains at least one kind of compound selected from the group of three kinds of compounds consisting of (a) a polyaminocarboxylic acid, (b) a carboxylic acid excluding polyaminocarboxylic acids and (c) ammonium fluoride.

23. A method for manufacturing a semiconductor device comprising the steps of:

forming a gate electrode and a diffused layer on a principal surface of a semiconductor substrate and then applying a heat treatment, forming an insulating film on the gate electrode and the diffused layer and then forming, in the insulating film, a contact plug reaching the gate electrode and/or the diffused layer, forming a barrier film on a back surface of the semiconductor substrate, and forming a copper-based metal film on the principal surface of the semiconductor substrate.

24. A method for manufacturing a semiconductor device according to claim 23, wherein the formation of the copper-based metal film is conducted by forming a copper-based metal film and then removing the unnecessary portion of the copper-based metal film.

25. A method for manufacturing a semiconductor device according to claim 24, wherein the removal of the unnecessary portion of the copper-based metal film is conducted by chemical mechanical polishing.

26. A method for manufacturing a semiconductor device according to claim 24, wherein the formation of the copper-based metal film is conducted by applying a plating treatment with a copper-based metal material and then applying an annealing treatment with the substrate temperature kept at 300° C. or higher.

27. A method for manufacturing a semiconductor device according to claim 23, wherein the barrier film is a silicon oxide film.

28. A method for manufacturing a semiconductor device according to claim 27, wherein the silicon oxide film is formed by CVD.

29. A method for manufacturing a semiconductor device according to claim 23, wherein the barrier film is a composite film consisting of a first film made of Ta, TaN, TiN, SiN or SiON and a second film which is a silicon oxide film, with the second film provided at the outer side of the composite film.

30. A method for manufacturing a semiconductor device according to claim 29, wherein the silicon oxide film is formed by CVD.

31. A method for manufacturing a semiconductor device according to claim 23, wherein, after the copper-based metal film has been formed, the surface of the barrier film is cleaned with a cleaning solution.

32. A method for manufacturing a semiconductor device according to claim 31, wherein the cleaning solution contains a complexing agent capable of forming a complex with copper-based contaminants.

33. A method for manufacturing a semiconductor device according to claim 32, wherein the complexing agent contains at least one kind of compound selected from the group of three kinds of compounds consisting of (a) a polyaminocarboxylic acid, (b) a carboxylic acid excluding polyaminocarboxylic acids and (c) ammonium fluoride.

* * * * *